US 7,018,941 B2

United States Patent
Cui et al.

(10) Patent No.: US 7,018,941 B2
(45) Date of Patent: Mar. 28, 2006

(54) POST TREATMENT OF LOW K DIELECTRIC FILMS

(75) Inventors: Zhenjiang Cui, San Jose, CA (US); Josephine J. Chang, Carmichael, CA (US); Alexandros T. Demos, Fremont, CA (US); Reza Arghavani, Scotts Valley, CA (US); Derek R. Witty, Fremont, CA (US); Helen R. Armer, Cupertino, CA (US); Girish A. Dixit, San Jose, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 28 days.

(21) Appl. No.: 10/830,203

(22) Filed: Apr. 21, 2004

(65) Prior Publication Data

US 2005/0239293 A1 Oct. 27, 2005

(51) Int. Cl.
*H01L 21/31* (2006.01)
*H01L 21/461* (2006.01)

(52) U.S. Cl. .................. 438/778; 438/786; 438/796
(58) Field of Classification Search ................. 438/778, 438/786, 796, 931, 395, 408
See application file for complete search history.

(56) References Cited

U.S. PATENT DOCUMENTS

| | | | |
|---|---|---|---|
| 5,003,178 A | 3/1991 | Livesay | |
| 6,025,279 A | 2/2000 | Chiang et al. | |
| 6,030,904 A | * 2/2000 | Grill et al. | 438/781 |
| 6,033,999 A | 3/2000 | Wu et al. | |
| 6,080,526 A | 6/2000 | Yang et al. | |
| 6,133,086 A | 10/2000 | Huang et al. | |
| 6,303,524 B1 | 10/2001 | Sharangpani et al. | |
| 6,383,951 B1 | 5/2002 | Li | |
| 6,437,406 B1 | 8/2002 | Lee | |
| 6,444,136 B1 | 9/2002 | Liu et al. | |
| 6,500,740 B1 | 12/2002 | Bevk | |
| 6,548,899 B1 | 4/2003 | Ross | |
| 6,566,278 B1 | 5/2003 | Harvey et al. | |
| 6,582,777 B1 | 6/2003 | Ross et al. | |

(Continued)

FOREIGN PATENT DOCUMENTS

WO    WO 01/48805 A1    7/2001

OTHER PUBLICATIONS

U. S. Appl. No. 10/773,060, filed Feb. 4, 2004 (AMAT/7034.P1).
U.S. Appl. No. 10/642,081, filed Aug. 14, 2003 (AMAT/8435.02).
U.S. Appl. No. 10/461,638, filed Jun. 12, 2003 (AMAT/8435).
U.S. Appl. No. 10/668,682, filed Sep. 22, 2003 (AMAT/7916).
PCT International Search Report for PCT/US2005/002927, dated Apr. 19, 2005. (AMAT/8856.PC)

*Primary Examiner*—George Fourson
*Assistant Examiner*—Michelle Estrada
(74) *Attorney, Agent, or Firm*—Patterson & Sheridan

(57) ABSTRACT

A method of depositing a low dielectric constant film on a substrate and post-treating the low dielectric constant film is provided. The post-treatment includes rapidly heating the low dielectric constant film to a desired high temperature and then rapidly cooling the low dielectric constant film such that the low dielectric constant film is exposed to the desired high temperature for about five seconds or less. In one aspect, the post-treatment also includes exposing the low dielectric constant film to an electron beam treatment and/or UV radiation.

20 Claims, 3 Drawing Sheets

U.S. PATENT DOCUMENTS

| | | |
|---|---|---|
| 6,586,297 B1 | 7/2003 | U'Ren et al. |
| 6,614,181 B1 | 9/2003 | Harvey et al. |
| 6,733,830 B1 * | 5/2004 | Todd .................... 427/255.28 |
| 6,737,365 B1 | 5/2004 | Kloster et al. |
| 6,764,940 B1 * | 7/2004 | Rozbicki et al. ............ 438/627 |
| 2001/0004479 A1 | 6/2001 | Cheung et al. |
| 2002/0105084 A1 | 8/2002 | Li |
| 2002/0110934 A1 | 8/2002 | Uchiyama et al. |
| 2002/0162500 A1 | 11/2002 | Hong et al. |
| 2003/0054115 A1 | 3/2003 | Albano et al. |
| 2003/0143865 A1 | 7/2003 | Grill et al. |
| 2003/0183611 A1 | 10/2003 | Gregor et al. |
| 2003/0232495 A1 | 12/2003 | Moghadam et al. |
| 2004/0002226 A1 | 1/2004 | Burnham et al. |
| 2004/0023485 A1 * | 2/2004 | Pan et al. .................... 438/637 |
| 2004/0096593 A1 | 5/2004 | Lukas et al. |
| 2004/0096672 A1 | 5/2004 | Lukas et al. |
| 2004/0101632 A1 | 5/2004 | Zhu et al. |
| 2004/0101633 A1 | 5/2004 | Zheng et al. |
| 2004/0121605 A1 | 6/2004 | Maydan et al. |
| 2005/0064726 A1 | 3/2005 | Reid et al. |

* cited by examiner

POST TREATMENT OF LOW K DIELECTRIC FILMS

BACKGROUND OF THE INVENTION

1. Field of the Invention

Embodiments of the present invention relate to the fabrication of integrated circuits. More particularly, embodiments of the present invention relate to a process for depositing and post-treating low dielectric constant films.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 µm and even 0.1 µm feature sizes, and tomorrow's plants soon will be producing devices having even smaller geometries.

In order to further reduce the size of devices on integrated circuits, it has become necessary to use conductive materials having low resistivity and to use insulators having low dielectric constants (k) to reduce the capacitive coupling between adjacent metal lines. Recent developments in low dielectric constant insulating films have focused on incorporating silicon (Si), carbon (C), and oxygen (O) atoms into the films. One challenge in this area has been to develop a Si, C, and O containing film that has a low k value and also exhibits desirable thermal and mechanical properties. Often Si, C, and O containing films that have a desirable dielectric constant exhibit poor mechanical strength and are easily damaged by etch chemistry and plasma exposure during subsequent processing, causing failure of the integrated circuit.

Thermal and plasma annealing processes have been developed in attempts to improve the properties of low dielectric constant films. Thermal and plasma annealing processes have typically been performed at temperatures of less than about 400° C. in order to prevent damage to other components of the substrate or device on which the low dielectric constant film is deposited. It has been found that thermal and plasma annealing processes can densify low dielectric constant films containing Si, C, and O. However, such annealing processes typically are performed for about 30 minutes to 2 hours, and thus significantly increase substrate processing times. Also, further improvements in the mechanical and dielectric properties of the low dielectric constant films are still desired.

Thus, there remains a need for a method of post-treating low dielectric constant films to improve the properties of the low dielectric constant films.

SUMMARY OF THE INVENTION

Embodiments of the invention provide a method of processing a substrate, comprising depositing a low dielectric constant film comprising silicon and carbon on a substrate in the presence of RF power and post-treating the deposited low dielectric constant film by a process comprising heating the low dielectric constant film to a desired temperature of at least about 600° C. at a rate of at least about 10° C./sec, wherein the low dielectric constant film is maintained at the desired temperature for about five seconds or less, and then cooling the low dielectric constant film at a rate of at least about 10° C./sec. In one embodiment, the low dielectric constant film is heated and cooled within a time period of about 0.5 minutes to about 5 minutes.

In one embodiment, the low dielectric constant film is heated from a temperature of between about 25° C. and about 250° C. to a desired temperature of between about 600° C. and about 1000° C., wherein the low dielectric constant film is heated at the desired temperature for about five seconds or less, and then cooled from the desired temperature, wherein the low dielectric constant film is heated and cooled within a time period of about 0.5 minutes to about 5 minutes.

Further embodiments of the invention include post-treating a low dielectric constant film by heating the low dielectric constant film to a desired temperature at a rate of at least about 10° C./sec, wherein the low dielectric constant film is maintained at the desired temperature for about five seconds or less, cooling the low dielectric constant film at a rate of at least about 10° C./sec, and treating the low dielectric constant film with one or more processes selected from the group consisting of an electron beam treatment and UV radiation treatment.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
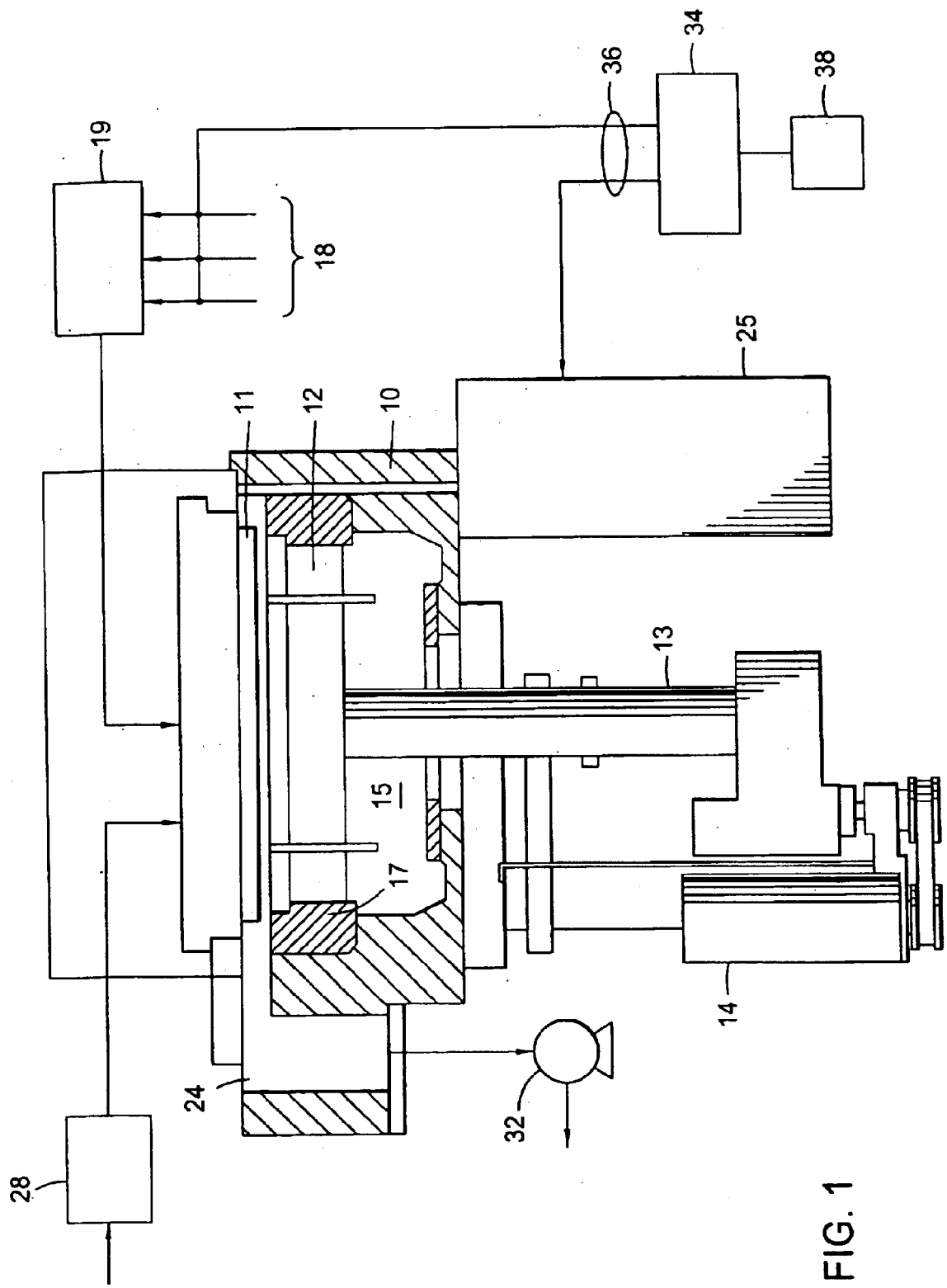
FIG. 1 is a cross-sectional diagram of an exemplary CVD reactor configured for use according to embodiments described herein.

Embodiments of the present invention provide a method of depositing a low dielectric constant film on a substrate and post-treating the low dielectric constant film by a process comprising rapidly heating the low dielectric constant film to a desired high temperature, such as between about 600° C. and about 1000° C., and then rapidly cooling the low dielectric constant film such that the low dielectric constant film is exposed to the desired high temperature for about five seconds or less. Preferably, the low dielectric constant film is exposed to the desired high temperature for about one second or less. In one aspect, the process of rapidly heating and cooling the low dielectric constant film is a spike annealing process.

Depositing the low dielectric constant film

The low dielectric constant film has a dielectric constant of less than about 4 and comprises silicon and carbon, and preferably, oxygen. The low dielectric constant film is deposited from a mixture comprising one or more organosilicon compounds in the presence of RF power. The one or more organosilicon compounds used to deposit the low dielectric constant layer may be organosilanes, organosiloxanes, or combinations thereof. The term "organosilicon compound" as used herein is intended to refer to compounds containing carbon atoms in organic groups, and can be cyclic or linear. Organic groups may include alkyl, alkenyl, cyclohexenyl, and aryl groups in addition to functional derivatives thereof. Preferably, the organosilicon compounds include one or more carbon atoms attached to a silicon atom such that the carbon atoms are not readily removed by oxidation at suitable processing conditions. The organosilicon compounds may also preferably include one or more oxygen atoms.

Suitable cyclic organosilicon compounds include a ring structure having three or more silicon atoms, and optionally one or more oxygen atoms. Commercially available cyclic organosilicon compounds that may be used include rings having alternating silicon and oxygen atoms with one or two alkyl groups bonded to the silicon atoms. Some exemplary cyclic organosilicon compounds include:

| | |
|---|---|
| 1,3,5-trisilano-2,4,6-trimethylene, | —(—$SiH_2CH_2$—)$_3$— (cyclic) |
| 1,3,5,7-tetramethylcyclotetrasiloxane (TMCTS), | —(—$SiHCH_3$—O—)$_4$— (cyclic) |
| octamethylcyclotetrasiloxane (OMCTS), | —(—$Si(CH_3)_2$—O—)$_4$— (cyclic) |
| 1,3,5,7,9-pentamethylcyclopentasiloxane, | —(—$SiHCH_3$—O—)$_5$— (cyclic) |
| 1,3,5,7-tetrasilano-2,6-dioxy-4,8-dimethylene, | —(—$SiH_2$—$CH_2$—$SiH_2$—O—)$_2$— (cyclic) |
| hexamethylcyclotrisiloxane | —(—$Si(CH_3)_2$—O—)$_3$— (cyclic). |

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| ethylsilane, | $CH_3$—$CH_2$—$SiH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| diethylsilane, | $(C_2H_5)_2$—$SiH_2$ |
| propylsilane, | $C_3H_7$—$SiH_3$ |
| vinylmethylsilane, | $(CH_2$=$CH)$—$SiH_2$—$CH_3$ |
| 1,1,2,2-tetramethyldisilane, | $(CH_3)_2$—$SiH$—$SiH$—$(CH_3)_2$ |
| hexamethyldisilane, | $(CH_3)_3$—$Si$—$Si$—$(CH_3)_3$ |
| 1,1,2,2,3,3-hexamethyltrisilane, | $(CH_3)_2$—$SiH$—$Si(CH_3)_2$—$SiH$—$(CH_3)_2$ |
| 1,1,2,3,3-pentamethyltrisilane, | $(CH_3)_2$—$SiH$—$SiH(CH_3)$—$SiH$—$(CH_3)_2$ |
| 1,3-bis(methylsilano)propane, | $CH_3$—$SiH_2$—$(CH_2)_3$—$SiH_2$—$CH_3$ |
| 1,2-bis(dimethylsilano)ethane, | $(CH_3)_2$—$SiH$—$(CH_2)_2$—$SiH$—$(CH_3)_2$ |
| 1,3-bis(dimethylsilano)propane, | $(CH_3)_2$—$SiH$—$(CH_2)_3$—$SiH$—$(CH_3)_2$ |
| diethoxymethylsilane (DEMS), | $CH_3$—$SiH$—$(O$—$CH_2$—$CH_3)_2$ |
| 1,3-dimethyldisiloxane, | $CH_3$—$SiH_2$—O—$SiH_2$—$CH_3$ |
| 1,1,3,3-tetramethyldisiloxane, | $(CH_3)_2$—$SiH$—O—$SiH$—$(CH_3)_2$ |
| hexamethyldisiloxane (HMDS), | $(CH_3)_3$—$Si$—O—$Si$—$(CH_3)_3$ |
| 1,3-bis(silanomethylene)disiloxane, | $(SiH_3$—$CH_2$—$SiH_2$—$)_2$—O |
| bis(1-methyldisiloxanyl)methane, | $(CH_3$—$SiH_2$—O—$SiH_2$—$)_2$—$CH_2$ |
| 2,2-bis(1-methyldisiloxanyl)propane, | $(CH_3$—$SiH_2$—O—$SiH_2$—$)_2$—$C(CH_3)_2$ |
| dimethyldimethoxysilane (DMDMOS), | $(CH_3O)_2$—$Si$—$(CH_3)_2$ |
| phenyldimethoxysilane, | $C_6H_5$—$SiH$—$(O$—$CH_3)_2$ |
| diphenylmethylsilane, | $(C_6H_5)_2$—$SiH$—$CH_3$ |
| dimethylphenylsilane, | $(CH_3)_2$—$SiH$—$C_6H_5$ |
| dimethoxymethylvinylsilane (DMMVS), | $(CH_3O)_2$—$Si(CH_3)$—$CH_2$=$CH_3$. |

In one embodiment, the low dielectric constant film is deposited from a mixture comprising one or more organosilicon compounds and one or more oxidizing gases in the presence of RF power. Oxidizing gases that may be used include oxygen ($O_2$), ozone ($O_3$), nitrous oxide ($N_2O$), carbon monoxide (CO), carbon dioxide ($CO_2$), water ($H_2O$), 2,3-butane dione, or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon containing compounds. Preferably, radio frequency (RF) power is applied to the reaction zone to increase dissociation.

Optionally, in addition to the one or more organosilicon compounds and the optional one or more oxidizing gases, one or more hydrocarbon compounds may be included in the mixture for depositing the low dielectric constant film. Hydrocarbon compounds that may be used include aliphatic hydrocarbon compounds having between one and about 20 adjacent carbon atoms. The hydrocarbon compounds can include adjacent carbon atoms that are bonded by any combination of single, double, and triple bonds. For example, the organic compounds may include alkenes and alkylenes having two to about 20 carbon atoms, such as ethylene, propylene, acetylene, and butadiene.

One or more hydrocarbon compounds having a cyclic group may also be used. The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. Further, the cyclic group is preferably bonded to a linear or branched functional group. The linear or branched functional group preferably contains an alkyl or vinyl alkyl group and has between one and twenty carbon atoms. The linear or branched functional group may also include oxygen atoms, such as in a ketone, ether, and ester. Some exemplary hydrocarbon compounds having at least one cyclic group include alpha-terpinene (ATP), vinylcyclohexane (VCH), and phenylacetate.

Optionally, one or more carrier gases may be included in the mixture used to deposit the low dielectric constant film. Carrier gases that may be used include argon, helium, carbon dioxide, and combinations thereof.

The film may be deposited using any processing chamber capable of chemical vapor deposition (CVD). FIG. 1 illustrates a vertical, cross-section view of a parallel plate CVD processing chamber 10 that may be used. The chamber 10 includes a high vacuum region 15 and a gas distribution manifold 11 having perforated holes for dispersing process gases therethrough to a substrate (not shown). The substrate rests on a substrate support plate or susceptor 12. The susceptor 12 is mounted on a support stem 13 that connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. An insulator 17 surrounds the susceptor 12 and the substrate when the susceptor 12 and the substrate are in an upper processing position.

Gases introduced to the manifold 11 are uniformly distributed radially across the surface of the substrate. A vacuum pump 32 having a throttle valve controls the exhaust rate of gases from the chamber 10 through a manifold 24. Deposition and carrier gases, if needed, flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

In one aspect, an organosilicon compound is introduced into the mixing system 19 at a flowrate for a 200 or 300 mm substrate of about 100 sccm to about 10,000 sccm. The optional hydrocarbon compound is introduced into the mixing system 19 at a flowrate of about 100 sccm to about 10,000 sccm. The optional oxidizing gas has a flowrate of about 100 sccm to about 6,000 sccm. The carrier gas has a flowrate of about 100 sccm to about 5,000 sccm. In a preferred embodiment, the organosilicon compound is octamethylcyclotetrasiloxane, and the hydrocarbon compound is ethylene.

The deposition process is preferably a plasma enhanced process. In a plasma enhanced process, a controlled plasma is typically formed adjacent the substrate by RF energy applied to the gas distribution manifold 11 using a RF power supply 25. Alternatively, RF power can be provided to the susceptor 12. The RF power to the deposition chamber may be cycled or pulsed to reduce heating of the substrate and promote greater porosity in the deposited film. The power density of the plasma for a 200 or 300 mm substrate is between about 0.03 W/cm$^2$ and about 3.2 W/cm$^2$, which corresponds to a RF power level of about 10 W to about 1,000 W for a 200 mm substrate and about 20 W to about 2,250 W for a 300 mm substrate. Preferably, the RF power level is between about 200 W and about 1,700 W for a 300 mm substrate.

The RF power supply 25 can supply a single frequency RF power between about 0.01 MHz and 300 MHz. Preferably, the RF power may be delivered using mixed, simultaneous frequencies to enhance the decomposition of reactive species introduced into the high vacuum region 15. In one aspect, the mixed frequency has a lower frequency of about 12 kHz and a higher frequency of about 13.56 mHz. In another aspect, the lower frequency may range between about 300 Hz to about 1,000 kHz, and the higher frequency may range between about 5 mHz and about 50 mHz. Preferably, the low frequency power level is about 150 W. Preferably, the high frequency power level is between about 200 W and about 750 W, more preferably, about 200 W to about 400 W.

During deposition, the substrate is maintained at a temperature between about −20° C. and about 500° C., preferably between about 100° C. and about 450° C. The deposition pressure is typically between about 1 Torr and about 20 Torr, preferably between about 4 Torr and about 7 Torr. An exemplary chamber that may be used to deposit a low dielectric constant layer according to embodiments described herein is provided below.

When remote dissociation of the oxidizing gas is desired, an optional microwave chamber 28 can be used to input power from between about 50 Watts and about 6,000 Watts to the oxidizing gas prior to the gas entering the processing chamber 10. The additional microwave power can avoid excessive dissociation of the organosilicon compounds prior to reaction with the oxidizing gas. A gas distribution plate (not shown) having separate passages for the organosilicon compound and the oxidizing gas is preferred when microwave power is added to the oxidizing gas.

Typically, any or the entire chamber lining, distribution manifold 11, susceptor 12, and various other reactor hardware are made out of materials such as aluminum or anodized aluminum. An example of such a CVD reactor is described in U.S. Pat. No. 5,000,113, entitled "A Thermal CVD/PECVD Reactor and Use for Thermal Chemical Vapor Deposition of Silicon Dioxide and In-situ Multi-step Planarized Process," issued to Wang et al., and assigned to Applied Materials, Inc., the assignee of the invention, and is incorporated by reference herein to the extent not inconsistent with the invention.

A system controller 34 controls the motor 14, the gas mixing system 19, and the high frequency power supply 25, which are connected therewith by control lines 36. The system controller 34 controls the activities of the CVD reactor and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard, which defines board, card cage, and connector dimensions and types. The VME standard also defines the bus structure having a 16-bit data bus and a 24-bit address bus. The system controller 34 operates under the control of a computer program stored on a hard disk drive 38.

The low dielectric constant films described herein may be deposited using a computer storage medium containing a software routine that, when executed, causes a general purpose computer to control a deposition chamber. The software routine may comprise instructions for depositing any of the films according to any of the embodiments described herein.

Post-treating the low dielectric constant film

After the low dielectric constant film is deposited, the low dielectric constant film is post-treated by a process comprising rapidly heating the low dielectric constant film to a desired high temperature and then rapidly cooling the low dielectric constant film. The desired high temperature may be between about 600° C. and about 1000° C. such as about 800° C. Preferably, the low dielectric constant film is heated from a temperature of between about 25° C. and about 250° C. at a rate of at least about 10° C./sec to the desired high temperature. For example, the low dielectric constant film may be heated at a rate between about 10° C./sec and about 300° C./sec. Preferably, the low dielectric constant film is heated at a rate between about 100° C./sec and about 300° C./sec, e.g., about 250° C./sec. After the low dielectric constant film reaches the desired temperature, the heat source(s) used to heat the low dielectric constant film are turned off, and the low dielectric constant film is cooled at a rate of at least about 10° C./sec, such as at a rate between about 10° C./sec and about 100° C./sec. The cooling of the low dielectric constant film may be enhanced by the presence of a reflective plate in the post-treatment chamber. Preferably, the cooling rate is enhanced by both the presence of a reflective plate in the post-treatment chamber and by exposing the backside of the substrate on which the low dielectric constant film is deposited to a flow of an inert gas such as helium. For example, the backside of the substrate may be exposed to a flow of helium at a rate of between about 10 sccm and about 500 sccm. Since the low dielectric constant film is rapidly heated and rapidly cooled, the length of time between the initiation of the heating of the low dielectric constant film and the termination of the cooling of the low dielectric constant film is typically between about 0.5 minutes and about 5 minutes.

Generally, the low dielectric constant film is heated and cooled in a chamber atmosphere that may include argon (Ar), nitrogen ($N_2$), helium (He), oxygen ($O_2$), hydrogen ($H_2$), water vapor ($H_2O$), nitrous oxide ($N_2O$), or combinations thereof. The chamber pressure may be between about 100 Torr and about 760 Torr. The chamber pressure may be adjusted to change the cooling rate of the low dielectric constant film.

In one embodiment, the low dielectric constant film is heated and cooled in an argon environment. In one embodiment, argon is introduced into the chamber at a rate between about 10 sccm and about 100 sccm.

Any chamber that is capable of rapidly heating a low dielectric constant film to a desired high temperature for about five seconds or less, preferably one second or less, and then rapidly cooling the low dielectric constant film may be used to post-treat the low dielectric constant film. An exemplary chamber that may be used to post-treat a low dielectric constant film according to embodiments described herein is provided below.

Figure 2:
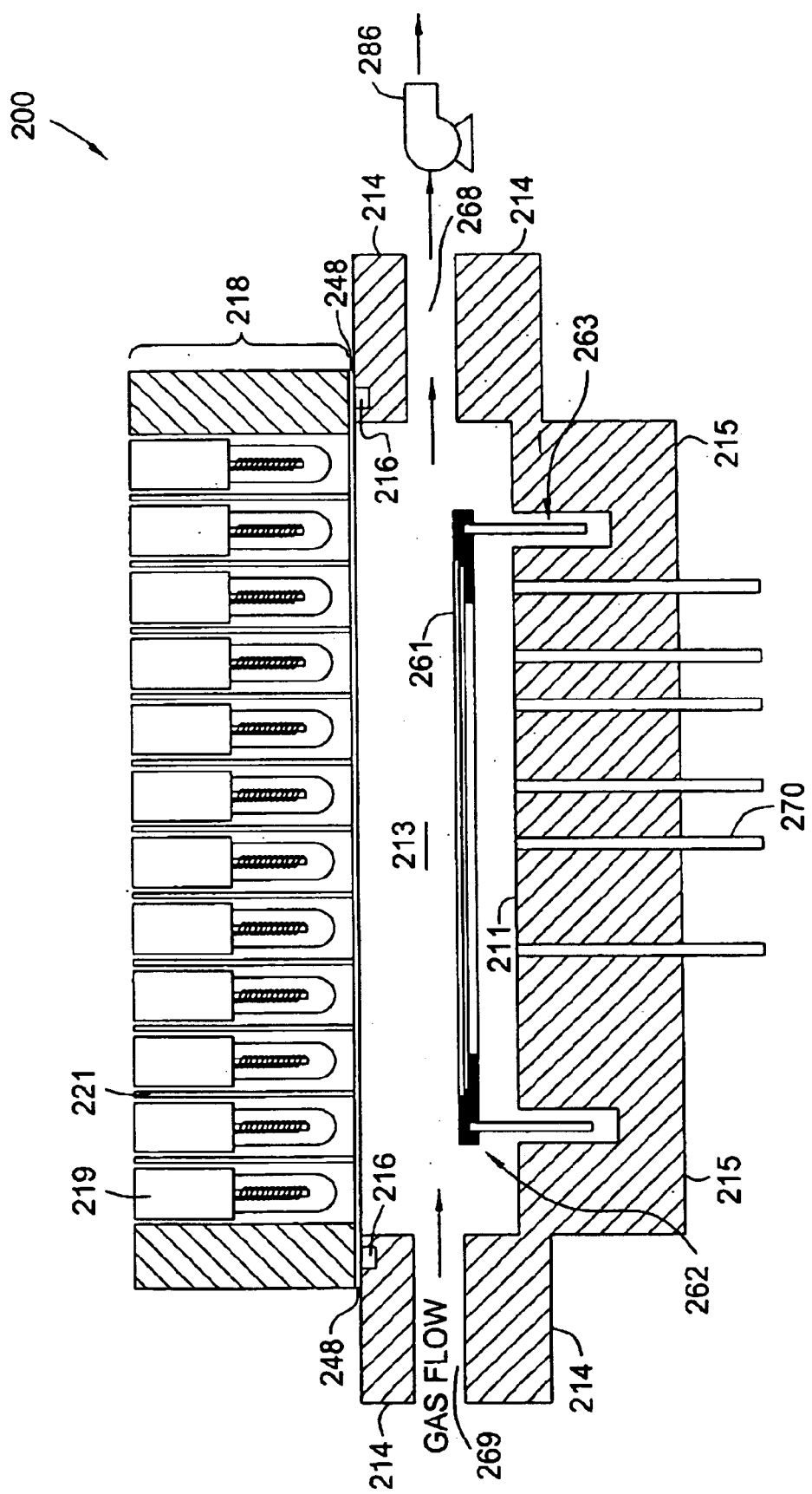
FIG. 2 is a diagrammatic view in vertical cross-section of a portion of a rapid thermal processing (RTP) chamber according to an embodiment of the present invention.

One chamber that may be used is the Radiance™ RTP chamber, available from Applied Materials, Inc. of Santa Clara, Calif. FIG. 2 illustrates a chamber 200 that is an embodiment of the Radiance™ RTP chamber. Chamber 200, as shown in FIG. 2, includes a process region 213 enclosed by a sidewall 214 and a bottom wall 215. The upper portion of sidewall 214 of chamber 200 is sealed to a window 248 by "O" rings 216.

A substrate or wafer 261 is supported on its edge inside region 213 by a support ring 262 typically made up of silicon carbide. Support ring 262 is mounted on a rotatable quartz cylinder 263. By rotating quartz cylinder 263 support ring 262 and wafer 261 can be caused to rotate. An additional silicon carbide adapter ring can be used to allow wafers to different diameters to be processed (e.g., 150 mm, 200 mm and 300 mm). The outside edge of support ring 262 preferably extends less than two inches from the outside diameter of wafer 261. The volume of chamber 200 is approximately nine liters for a 300 mm system.

Chamber 200 includes a gas inlet 269 formed through sidewall 214 for injecting process gas into region 213 to allow various processing steps to be carried out in region 213. Positioned on the opposite side of gas inlet 269, in sidewall 214, is a gas outlet 268. Gas outlet 268 is coupled to a vacuum source 286, such as a pump, to exhaust process gas from chamber 200 and to reduce the pressure in chamber 200. The vacuum source 286 maintains a desired pressure while process gas is fed into the chamber during processing.

A radiant energy assembly 218 is positioned over the window 248. The radiant energy assembly 218 includes a plurality of tungsten halogen lamps 219, for example Sylvania EYT lamps, each mounted into a light pipe 221 which can be a stainless steel, gold, brass, aluminum or other metal. Lamps 219 include a filament wound as a coil with its axis parallel to that of the lamp envelope. Most of the light is emitted perpendicular to the axis towards the wall of the surrounding light pipe 221. The light pipe length is selected to at least be as long as the associated lamp. The light pipe 221 may be longer provided that the power reaching the wafer is not substantially attenuated by increased reflection. The lamps 219 are positioned in a hexagonal array or in a "honeycomb shape." Lamps 219 are positioned to adequately cover the entire surface area of wafer 261 and support ring 262. Lamps 219 (which may be on the order of hundreds) are grouped in zones which can be independently controlled to provide for extremely uniform or non-uniform heating of wafer 261, as is desired according to the process.

The radiant energy source 218 comprising the plurality of light pipes 221 and associated lamps 219 allows the use of a thin quartz window 248 to provide an optical port for heating a substrate within the evacuative process chamber. A primary purpose of the window 248 is to isolate the process environment from the lamps 219 as the lamps 219 can get too hot and react with the process gases. Light pipes 221 can be cooled by flowing a coolant, such as water, between the various heat pipes.

While the radiant energy source 218 is described above as including a plurality of tungsten halogen lamps 219, in another embodiment, the radiant energy source 218 includes ultraviolet lamps.

The bottom wall 215 of chamber 200 includes a top surface 211 for reflecting energy onto the backside of wafer 261. Additionally, chamber 200 includes a plurality of optical temperature probes 270 positioned through the bottom wall 215 of chamber 200 in order to detect the temperature of wafer 261 at a plurality of locations across its bottom surface. Reflections between the backside of the silicon wafer 261 and reflecting surface 211 create a blackbody cavity which makes temperature measurement independent of wafer backside emissivity and thereby provides accurate temperature measurement capability.

In one embodiment, the reflective surface 211 is in the form of an absorbing reflector plate that is reflective at wavelengths of 0.7–0.96 nm and reflective at other wavelengths emitted by the radiant energy assembly 218. The absorbing property of the reflector plate enhances the cooling rate of the low dielectric constant film. The cooling rate of the low dielectric constant film may be further enhanced by exposing the backside of the substrate on which the low dielectric constant film is deposited to a flow of an inert gas, such as by introducing inert gas around the edge of the reflector plate or through holes in the reflector plate to the backside of the substrate.

Aspects of the chamber 200 are operated by a control system (not shown). The control system may include any number of controllers, processors and input/output devices. In one embodiment, the control system is a component of a closed loop feedback system which monitors various parameters within the process chamber 200 while processing a substrate, and then issues one or more control signals to make necessary adjustments according to various setpoints. In general, the parameters being monitored include the temperature, pressure, and gas flow rates.

In a further embodiment, post-treating the low dielectric constant film comprises rapidly heating the low dielectric constant film to a desired high temperature, rapidly cooling the low dielectric constant film from the desired high temperature, and treating the low dielectric constant film with an electron beam treatment. The low dielectric constant film may be treated with an electron beam treatment before or after the rapid heating and cooling.

The electron beam (e-beam) treatment typically has a dose between about 50 and about 2000 micro coulombs per square centimeter ($\mu c/cm^2$) at about 1 to 20 kiloelectron volts (KeV). The e-beam current typically ranges from about 1 mA to about 40 mA, and is preferably about 1 to about 20 mA. The e-beam treatment is typically operated at a temperature between about room temperature and about 450° C. for about 10 seconds to about 15 minutes. In one aspect, the e-beam treatment conditions include 6 kV, 10–18 mA and 50 $\mu c/cm^2$ at 350° C. for about 15 to about 30 seconds to treat a film having a thickness of about 1 micron. In another aspect, the e-beam treatment conditions include 4.5 kV, 10–18 mA and 50 $\mu c/cm^2$ at 350° C. for about 15 to about 30 seconds to treat a film having a thickness of about 5000 Å. Argon or hydrogen may be present during the electron beam treatment. Although any e-beam device may be used, one exemplary device is the EBK chamber, available from Applied Materials, Inc. Treating the low dielectric constant film with an electron beam after the low dielectric constant film is deposited will volatilize at least some of the organic groups in the film and thus may form voids in the film.

Figure 3:
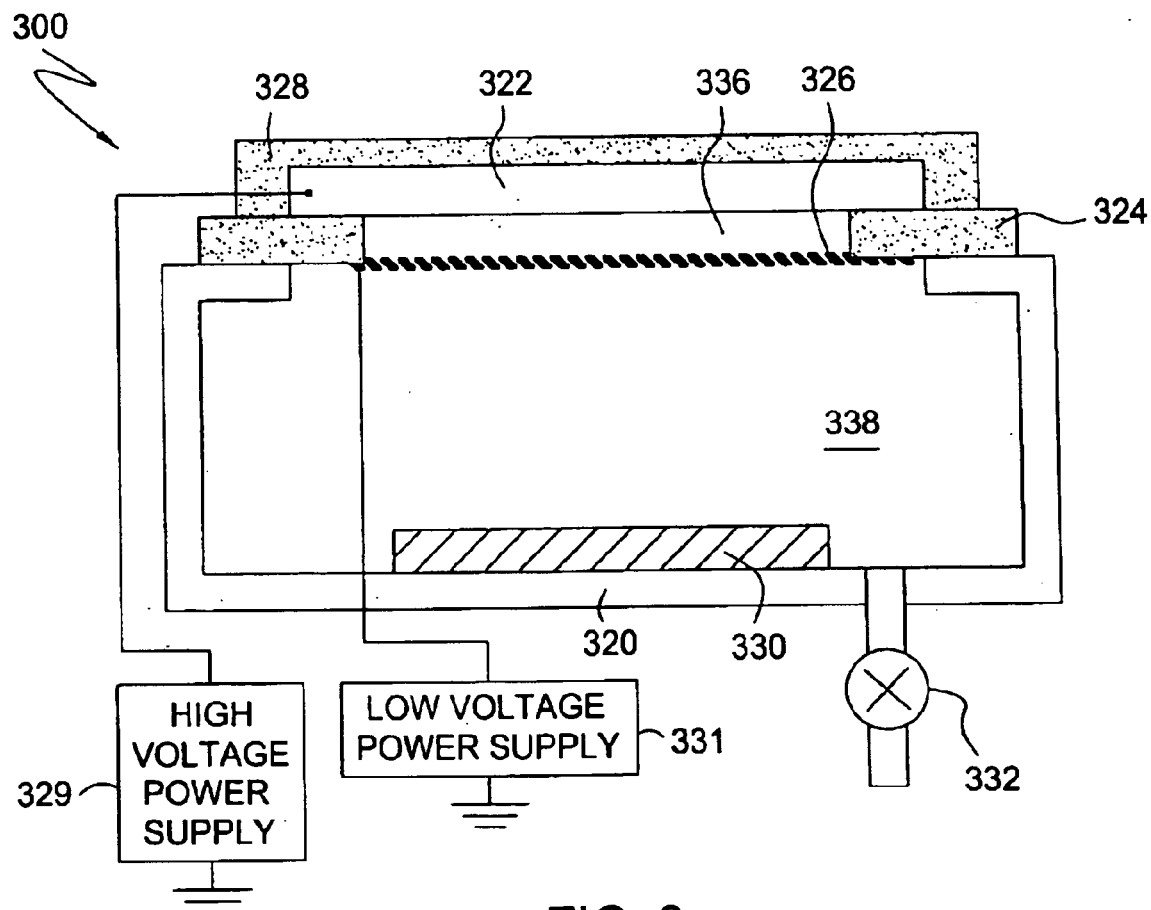
FIG. 3 is an electron beam chamber in accordance with an embodiment of the invention.

FIG. 3 illustrates an e-beam chamber 300 in accordance with an embodiment of the invention. The e-beam chamber 300 includes a vacuum chamber 320, a large-area cathode 322, a target plane 330 located in a field-free region 338, and a grid anode 326 positioned between the target plane 330 and the large-area cathode 322. The e-beam chamber 300 further includes a high voltage insulator 324 and an accelerating field region 336 which isolate the grid anode 326 from the large-area cathode 322, a cathode cover insulator 328 located outside the vacuum chamber 320, a variable leak valve 332 for controlling the pressure inside the vacuum chamber 320, a variable high voltage power supply 329 connected to the large-area cathode 322, and a variable low voltage power supply 331 connected to the grid anode 326.

In operation, the substrate (not shown) with the low dielectric constant film thereon to be exposed with the electron beam is placed on the target plane 330. The vacuum chamber 320 is pumped from atmospheric pressure to a pressure in the range of about 1 mTorr to about 200 mTorr. The exact pressure is controlled by the variable rate leak valve 332, which is capable of controlling pressure to about 0.1 mTorr. The electron beam is generally generated at a sufficiently high voltage, which is applied to the large-area cathode 322 by the high voltage power supply 329. The voltage may range from about −500 volts to about 30,000 volts or higher. The high voltage power supply 329 may be a Bertan Model #105-30R manufactured by Bertan of Hickville, N.Y., or a Spellman Model #SL30N-1200X 258 manufactured by Spellman High Voltage Electronics Corp., of Hauppauge, N.Y. The variable low voltage power supply 331 applies a voltage to the grid anode 326 that is positive relative to the voltage applied to the large-area cathode 322. This voltage is used to control electron emission from the large-area cathode 322. The variable low voltage power supply 331 may be an Acopian Model #150PT12 power supply available from Acopian of Easton, Pa.

Other details of the e-beam chamber 300 are described in U.S. Pat. No. 5,003,178, entitled "Large-Area Uniform Electron Source", issued to William R. Livesay, assigned to Electron Vision Corporation (which is currently owned by the assignee of the present invention) and is incorporated by reference herein to the extent not inconsistent with the invention.

In another embodiment, post-treating the low dielectric constant film comprises rapidly heating the low dielectric constant film to a desired high temperature, rapidly cooling the low dielectric constant film from the desired high temperature, and treating the low dielectric constant film with UV radiation. Preferably, the low dielectric constant film is treated with UV radiation simultaneously with at least a portion of the rapid heating and/or cooling of the low dielectric constant film. However, the low dielectric constant film may be treated with UV radiation before or after the low dielectric constant film is rapidly heated and cooled. In embodiments in which the low dielectric constant film is treated with UV radiation before or after the low dielectric constant film is rapidly heated and cooled, preferably, the low dielectric constant film is heated at a temperature between about 200° C. and about 600° C. during the UV radiation. For example, the low dielectric constant film may be exposed to UV radiation in a chamber such as a furnace having a UV source. The chamber may have either a vacuum or atmospheric ambient during the UV radiation treatment.

The low dielectric constant film may be exposed to one or more wavelengths of UV radiation. An example of a chamber and a method that may be used to expose the low dielectric constant film to UV radiation is provided in commonly assigned U.S. Pat. No. 6,614,181, which is incorporated by reference herein.

In a further embodiment, the low dielectric constant film is post-treated by a method comprising rapidly heating and cooling the low dielectric constant film, treating the low dielectric constant film with UV radiation, and treating the low dielectric constant film with an electron beam. The post-treatment processes may be performed in any order. However, preferably, the low dielectric constant film is post-treated by rapidly heating and cooling the low dielectric constant film according to embodiments described herein and simultaneously UV radiating the low dielectric constant film and then treating the low dielectric constant film with an electron beam.

It is believed that post-treatments that include both rapidly heating and cooling the low dielectric constant film and UV radiating and/or treating the low dielectric constant film with an electron beam enhance the properties of the low dielectric constant film. For example, it is believed that a post-treatment that includes rapid heating and cooling and UV radiation lowers the dielectric constant of the deposited film. It is believed that a post-treatment that includes rapid heating and cooling, an electron beam treatment, and optionally UV radiation lowers the dielectric constant of the deposited film and increases the film's hardness and modulus.

In any of the embodiments described herein, the low dielectric constant films may be deposited and post-treated within an integrated processing system, such as the Centura® or Producer® platform, available from Applied Materials, Inc. Thus, the low dielectric constant film can be deposited and post-treated without exposing the film to atmosphere. In embodiments in which more than one post-treatment process is performed, the low dielectric constant film may be protected from atmosphere between the different post-treatment processes. For example, the low dielectric constant film may be transferred to an electron beam chamber after being rapidly heated and cooled and optionally UV radiated in another chamber without being exposed to atmosphere between the rapid heating and cooling and the electron beam treatment.

The following examples illustrate methods of processing substrates having low dielectric constant films deposited thereon. The films were deposited on 300 mm substrates using a Producer® CVD chamber, available from Applied Materials, Inc.

COMPARISON EXAMPLE 1

A low dielectric constant film comprising silicon, carbon, and oxygen was deposited on a substrate from a gas mixture comprising OMCTS, trimethylsilane, and ethylene. The OMCTS was introduced into the chamber at a rate of 520 sccm, the trimethylsilane was introduced into the chamber at a rate of 300 sccm, and the ethylene was introduced into the chamber at a rate of 2200 sccm. Helium was introduced into the chamber at a rate of 1000 sccm, and oxygen was introduced into the chamber at a rate of 1000 sccm. The film was deposited for 20 seconds at 400° C. at a pressure of 5.7 Torr using 800 W RF power at 13.56 MHz. As deposited, the low dielectric constant film had a thickness of 5,043 Å, a dielectric constant (k) of 2.77, and a hardness of 0.59 gPa.

COMPARISON EXAMPLE 2

A low dielectric constant film was deposited on a substrate as described in Comparison Example 1. The low dielectric constant film was post-treated by thermally annealing the low dielectric constant film at a temperature of 800° C. for 1 minute. As deposited, the low dielectric constant film had a thickness of 5,085 Å. After the post-treatment, the low dielectric constant film had a thickness of 4,463 Å (shrinkage of 12.2%). After the post-treatment, the low dielectric constant film had a dielectric constant (k) of 3.35, and a hardness of 1.82 gPa.

COMPARISON EXAMPLE 3

A low dielectric constant film was deposited on a substrate as described in Comparison Example 1. The low dielectric constant film was post-treated by an electron beam treatment at a current of 3 mA and a dose of 100 μc/cm$^2$ at 4.5 kV and 400° C. As deposited, the low dielectric constant film had a thickness of 5,074 Å. After the post-treatment, the low dielectric constant film had a thickness of 4,763 Å (shrinkage of 6.1%). After the post-treatment, the low dielectric constant film had a dielectric constant (k) of 2.74, and a hardness of 1.14 gPa.

EXAMPLE 1

A low dielectric constant film was deposited on a substrate as described in Comparison Example 1. The low dielectric constant film was post-treated in a Radiance™ RTP chamber by rapidly heating the dielectric constant film from room temperature to a temperature of 800° C. and then immediately cooling the low dielectric constant film to a temperature of 120° C. such that the film is heated and cooled within 30 seconds. As deposited, the low dielectric constant film had a thickness of 5,036 Å. After the post-treatment, the low dielectric constant film had a thickness of 5,021 Å (shrinkage of 0.3%). After the post-treatment, the low dielectric constant film had a dielectric constant (k) of 2.53, and a hardness of 0.62 gPa.

EXAMPLE 2

A low dielectric constant film was deposited on a substrate as described in Comparison Example 1. The low dielectric constant film was post-treated in a Radiance™ RTP chamber by rapidly heating the dielectric constant film from room temperature to a temperature of 800° C. and then immediately cooling the low dielectric constant film to a temperature of 120° C. such that the film is heated and cooled within 30 seconds. As deposited, the low dielectric constant film had a thickness of 5,011 Å. After the post-treatment, the low dielectric constant film had a thickness of 4,996 Å (shrinkage of 0.3%). After the post-treatment, the low dielectric constant film had a dielectric constant (k) of 2.44.

Examples 1 and 2 show that post-treating low dielectric constant films by rapidly heating and cooling the low dielectric constant films according to embodiments described herein resulted in films having a lower dielectric constant than films that were not post-treated or films that were post-treated by an electron beam treatment or a conventional annealing process. It is believed that the low dielectric constant of films treated with the post-treatments provided herein may be achieved by the release of porogens, such as organic groups, from the low dielectric constant films upon post-treatment of the low dielectric constant films.

Example 1 further demonstrates that the rapid heating and cooling of the low dielectric constant films according to embodiments described herein did not substantially affect the hardness of the deposited film. The Examples also show that post-treating low dielectric constant films according to embodiments described herein resulted in less film shrinkage than other post-treatment processes.

Thus, embodiments of the invention provide a method of post-treating a low dielectric constant film that lowers the dielectric constant of the film without reducing the hardness of the film and minimizes film shrinkage from the post-treatment. Other advantages of the rapid heating and cooling post-treatment of embodiments of the invention include a higher substrate throughput resulting from the quick post-treatment process and a lower thermal budget for substrates processed according to the embodiments.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
    depositing a low dielectric constant film comprising silicon and carbon on a substrate in the presence of RF power; and
    post-treating the depositing low dielectric constant film by a process comprising:
        heating the low dielectric constant film to a desired temperature of at least about 600° C. at a rate of at least about 10° C./sec, wherein the low dielectric constant film is maintained at the desired temperature for about five seconds or less; and then
        cooling the low dielectric constant film at a rate of at least about 10° C./sec.

2. The method of claim 1, wherein the post-treating is performed under conditions sufficient to lower the dielectric constant of the low dielectric constant film.

3. The method of claim 1, wherein the low dielectric constant film is heated at a rate between about 10° C./sec and about 300° C./sec and cooled at a rate between about 10° C./sec and about 100° C./sec.

4. The method of claim 1, wherein the post-treating further comprises treating the low dielectric constant film with UV radiation.

5. The method of claim 4, wherein the process comprising heating and cooling the low dielectric constant film is performed simultaneously with the treating the low dielectric constant film with UV radiation.

6. The method of claim 5, wherein the post-treating further comprises treating the low dielectric constant film with an electron beam.

7. The method of claim 6, wherein the low dielectric constant film is post-treated in an integrated processing system such that the low dielectric constant film is not exposed to atmosphere between the heating and the treating of the low dielectric constant film with an electron beam.

8. The method of claim 4, wherein the process comprising heating and cooling the low dielectric constant film and the treating the low dielectric constant film with UV radiation are performed sequentially.

9. The method of claim 1, wherein the post-treating further comprises treating the low dielectric constant film with an electron beam.

10. The method of claim 9, wherein the low dielectric constant film is post-treated in an integrated processing system such that the low dielectric constant film is not exposed to atmosphere between the heating and the treating the low dielectric constant film with an electron beam.

11. The method of claim 1, wherein the low dielectric constant film further comprises oxygen.

12. A method of processing a substrate, comprising:
depositing a low dielectric constant film comprising silicon and carbon on a substrate in the presence of RF power; and
post-treating the deposited low dielectric constant film by a process comprising:
heating the low dielectric constant film from a temperature of between about 25° C. and about 250° C. to a temperature of between about 600° C. and about 1000° C., wherein the low dielectric constant film is heated at the temperature of between about 600° C. and about 1000° C. for about five seconds or less; and then
cooling the low dielectric constant film from a temperature of between about 600° C. and about 1000° C., wherein the low dielectric constant film is heated and cooled within a time period of about 0.5 minutes to about 5 minutes.

13. The method of claim 12, wherein the low dielectric constant film is heated at a rate between about 10° C./sec and about 300° C./sec and cooled at a rate between about 10° C./sec and about 100° C./sec.

14. The method of claim 12, wherein the post-treating further comprises treating the low dielectric constant film with UV radiation.

15. The method of claim 12, wherein the post-treating further comprises treating the low dielectric constant film with an electron beam.

16. The method of claim 12, wherein the cooling the low dielectric constant film comprises exposing the substrate to backside gas.

17. A method of processing a substrate, comprising:
depositing a low dielectric constant film comprising silicon and carbon on a substrate in the presence of RF power; and
post-treating the deposited low dielectric constant film by a process comprising:
heating the low dielectric constant film to a desired temperature at a rate of at least about 10° C./sec, wherein the low dielectric constant film is maintained at the desired temperature for about five seconds or less; and then
cooling the low dielectric constant film at a rate of at least about 10° C./sec, wherein the low dielectric constant film is heated and cooled within a time period of about 0.5 minutes to about 5 minutes.

18. The method of claim 17, wherein the low dielectric constant film is heated from a temperature of between about 25° C. and about 250° C., and the desired temperature is between about 800° C. and about 900° C.

19. The method of claim 17, wherein the post-treating further comprises treating the low dielectric constant film with UV radiation.

20. The method of claim 17, wherein the post-treating further comprises treating the low dielectric constant film with an electron beam.

* * * * *